US011333689B2

(12) United States Patent
Guibert et al.

(10) Patent No.: US 11,333,689 B2
(45) Date of Patent: May 17, 2022

(54) METHOD AND SYSTEM FOR MEASURING ELECTRICAL QUANTITIES

(71) Applicant: Schneider Electric Industries SAS, Rueil Malmaison (FR)

(72) Inventors: Philippe Guibert, Vif (FR); Gilles Henry, Paris (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 188 days.

(21) Appl. No.: 16/715,729

(22) Filed: Dec. 16, 2019

(65) Prior Publication Data
US 2020/0200802 A1     Jun. 25, 2020

(30) Foreign Application Priority Data
Dec. 20, 2018    (FR) ...................................... 1873633

(51) Int. Cl.
    *G01R 19/00*        (2006.01)
    *G01R 19/165*      (2006.01)
    *G01R 19/22*        (2006.01)

(52) U.S. Cl.
    CPC ....... *G01R 19/0038* (2013.01); *G01R 19/165* (2013.01); *G01R 19/22* (2013.01)

(58) Field of Classification Search
None
See application file for complete search history.

(56) References Cited

U.S. PATENT DOCUMENTS 4,156,112 A   *   5/1979   Moreland .............. G08C 15/12
                                                                 370/438

\* cited by examiner

*Primary Examiner* — Daniel C Puentes
(74) *Attorney, Agent, or Firm* — Locke Lord LLP

(57) ABSTRACT

Method and system for measuring electrical quantities. The method comprising:
the dispatching of a synchronization message on a data bus, by a synchronization module connected to the data bus, the dispatching being carried out with an emission period, the emission period being counted down with the aid of a first clock of the synchronization module;
the reception of the synchronization message, by measurement modules connected to the data bus, each measurement module comprising a sensor adapted to measure an electrical quantity, each measurement module also comprising a second clock;
the countdown, by each measurement module that has received the synchronization message, of a first waiting duration, the countdown being carried out, for each of the said measurement modules, using the second clock belonging to this measurement module; and
for each of the said measurement modules, the measurement of the electrical quantity by means of the corresponding sensor, at the end of the countdown of the first waiting duration.

17 Claims, 11 Drawing Sheets

METHOD AND SYSTEM FOR MEASURING ELECTRICAL QUANTITIES

TECHNICAL FIELD

The invention relates to a method for measuring electrical quantities and to a system for measuring electrical quantities.

BACKGROUND

In the field of industrial instrumentation, sensors intended to measure electrical quantities within electrical installations, such as networks for distributing electricity, already exist. The electrical quantities measured by the sensors may be used to monitor and supervise the electrical installation. In certain applications, it is necessary for the measurements of certain electrical quantities to be carried out simultaneously by all the sensors.

For example, sensors are associated with the electrical conductors of an electrical installation distributing an AC electrical current. Various electrical quantities, such as the electrical voltage between two electrical conductors, or the magnitude of an electrical current flowing through an electrical conductor, are measured by various sensors able to be placed at various locations in the electrical installation. The measurements are carried out at successive times over time. Other electrical quantities, in particular electrical power values, are then computed, for the corresponding instants of time, from the measured current and voltage values.

In order for the computed electrical quantities to be precise, it is necessary for the measured electrical quantities associated with a given instant of time to be measured simultaneously or almost simultaneously by all the sensors.

It is therefore desirable to be able to synchronize the measurements of the sensors simply and reliably.

SUMMARY

To this end, according to one aspect of the invention, a method for measuring electrical quantities comprises:
  the dispatching of a synchronization message on a data bus, by a synchronization module connected to the data bus, the dispatching being carried out with an emission period, the emission period being counted down with the aid of a first clock of the synchronization module;
  the reception of the synchronization message, by measurement modules connected to the data bus, each measurement module comprising a sensor adapted to measure an electrical quantity, each measurement module also comprising an electronic processing unit comprising a second clock;
  the countdown, by each measurement module that has received the synchronization message, of a first waiting duration, the countdown being carried out, for each of the said measurement modules, using the second clock belonging to this measurement module;
  for each of the said measurement modules, the measurement of the electrical quantity by means of the corresponding sensor at the end of the countdown of the first waiting duration.

According to advantageous but non-obligatory aspects, such a measuring method may incorporate one or more of the following features, alone or in any technically acceptable combination:
  The method furthermore comprises, for each of the said measurement modules:
    at the end of the measurement of the electrical quantity, the countdown of a second waiting duration, using the corresponding second clock;
    again measuring the electrical quantity, in an additional measurement, by means of the corresponding sensor, at the end of the countdown of the second waiting duration.
  The method furthermore comprises, for each of the said measurement modules, the measurement of the time interval separating the reception of two consecutive synchronization messages by this measurement module, this measurement being carried out by the measurement module using its second clock, and the first waiting duration is determined, for this measurement module, depending on the said time interval measured beforehand by this measurement module.
  The first waiting duration is determined, for each of the said measurement modules, following each reception of a synchronization message by this measurement module, using a predetermined computational formula depending on the value of the said time interval measured beforehand by this measurement module, wherein the first waiting duration is for example proportional to the said value of the said time interval depending on a first predefined coefficient of proportionality.
  The method comprises measuring the time interval separating the reception of two consecutive synchronization messages by this measurement module, this measurement being carried out by the measurement module using its second clock and the second waiting duration is determined, for each of the said measurement modules, depending on the said time interval measured beforehand by this measurement module.
  The second waiting duration is determined, for each of the said measurement modules, following each reception of a synchronization message by this measurement module, using a predetermined computational formula depending on the said time interval measured beforehand by this measurement module, wherein the second waiting duration is for example proportional to the said value of the said time interval depending on a second predefined coefficient of proportionality.
  The additional measurements are repeated by the measurement module until the following synchronization message is received by the measurement module.
  The measured time interval is not taken into account by the measurement module when the number of measurements made by this measurement module during this time interval is different from a predefined number of measurements.
  The dispatching of the synchronization message is carried out periodically with the predefined emission period.
  The dispatching of the synchronization message is carried out with an emission cycle of variable duration.
  The measurement modules are associated with electrical conductors of an electrical installation, at least one of the measurement modules being configured to measure an electrical voltage, at least one plurality of the other measurement modules being configured to measure a magnitude of an electrical current.

Other aspects of the invention relate to a system for measuring electrical quantities, comprising:
  a synchronization module comprising a first clock;

measurement modules, each measurement module comprising a sensor adapted to measure an electrical quantity, each measurement module also comprising a second clock, a data bus, the synchronization module and the measurement modules being connected to the data bus, wherein the synchronization module is configured to periodically dispatch a synchronization message on the data bus, with a predefined emission period, the emission period being counted down with the aid of the first clock;

and wherein each measurement module is configured to:
receive synchronization messages,
after each reception of a synchronization message, count down a first waiting duration, the countdown being carried out, for each of the said measurement modules, using the second clock belonging to this measurement module;
measure the electrical quantity by means of the corresponding sensor at the end of the countdown of the first waiting duration.

According to advantageous but non-obligatory aspects, such a measuring method may incorporate one or more of the following features, alone or in any technically acceptable combination:

each measurement module is furthermore configured to, at the end of the measurement of the electrical quantity, count down a second waiting duration, using the corresponding second clock, then again measure the electrical quantity, in an additional measurement, by means of the corresponding sensor, at the end of the countdown of the second waiting duration.

each measurement module is furthermore configured to repeat the additional measurements until the following synchronization message is received by the measurement module.

BRIEF DESCRIPTION OF THE DRAWINGS

The invention will be better understood and other advantages thereof will become more clearly apparent in light of the following description of one embodiment of a measuring method and of a measuring system, which is given merely by way of example and with reference to the appended drawings, in which.

DETAILED DESCRIPTION

Figure 1:
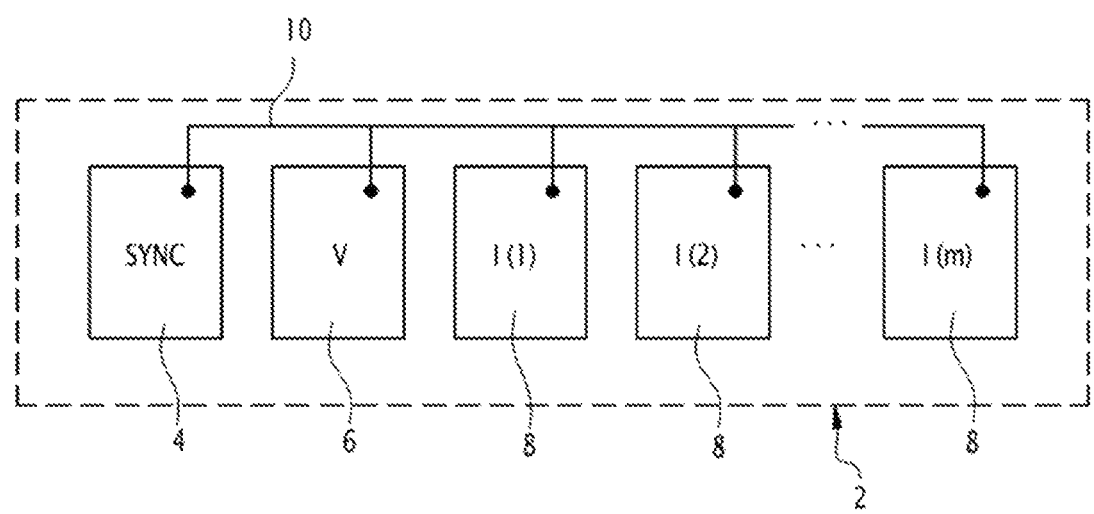
FIG. 1 is a schematic illustration of a system for measuring electrical quantities according to one method of implementation of the invention.
Figure 2:
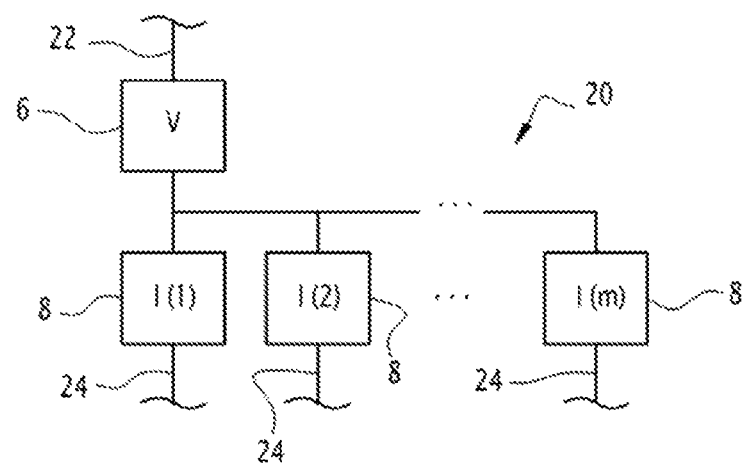
FIG. 2 is a schematic illustration of an electrical installation in which the measurement system of FIG. 1 is installed.

FIGS. 1 and 2 schematically show a measurement system 2 for measuring electrical quantities.

The system 2 is intended to be associated with an electrical installation, such as a network for distributing electricity, in order to measure electrical quantities within this electrical installation.

The system 2 comprises a synchronization module 4, measurement modules 6 and 8, and a data bus 10 to which the synchronization module 4 and the measurement modules 6 and 8 are connected.

Each measurement module 6, 8 comprises a sensor adapted to measure an electrical quantity. In the examples, electrical quantities may be, non-exhaustively, electrical voltages, or electrical currents. The measurement modules 6, 8 may measure different electrical quantities. The sensor of each measurement module 6 and 8 is therefore chosen accordingly.

For example, when the measuring module is intended to measure an electrical current, the sensor is a current sensor, such as a Rogowski torus, or a current transformer, or a hall-effect sensor, or a shunt.

When the measurement module is intended to measure an electrical voltage, the sensor is a voltage sensor, for example a shunt, or a voltage transformer, or a capacitive sensor.

In the illustrated embodiments, a first measurement module 6 is configured to measure an electrical voltage and the second measurement modules 8 are configured to measure a magnitude of an electrical current.

For example, the system 2 comprises a number "m" of second measurement modules 8, where "m" is an integer number higher than or equal to 1. To simplify FIGS. 1 and 2, only one portion of the second measurement modules 8 has been issued illustrated.

According to one illustrative and not necessarily limiting example schematically shown in FIG. 2, the electrical installation 20 comprises a primary line 22 and a plurality of secondary lines 24. The primary line 22 is connected to an electrical source, such as a generator or a distribution transformer, or to another electrical network. Each secondary line 24 connects the primary line 22 to a client unit, comprising for example an electrical load. Other configurations are however possible.

The respective sensors of the measurement modules 6, 8 are here associated with electrical conductors of the electrical installation 20, which are, for example, mounted on or around electrical conductors forming the lines 22, 24, in order to measure one or more electrical quantities relative to these electrical lines 22, 24.

In the illustrated example, the first measurement module 6 is mounted on the main line 22 in order to measure an electrical voltage V. The second measurement modules 8 are each mounted on one secondary line 24 in order to measure an electrical magnitude I(1), I(2), . . . , I(m). In order to simplify FIG. 2, the synchronization module 4 and the connection bus 10 have not been illustrated.

Other examples are nevertheless possible. To simplify matters, the installation 20 is here considered to comprise only one electrical phase, but the described examples may be generalized to a multi-phase electrical installation for which each line 22, 24 comprises a plurality of electrical phases.

The data bus 10 allows the modules 4, 6 and 8 to exchange data with one another. For example, the data bus 10 includes a wired link that forms a physical layer of the data bus 10. By way of illustrative and nonlimiting example, the data bus 10 is a fieldbus, for example of CAN, TCP Modbus or MODBUS type.

In the illustrated example, the modules 4, 6 and 8 are connected in series by the data bus 10. As a variant, however, the topology of the data bus 10 may be different and the modules 4, 6 and 8 may for example be connected in a star topology, or connected in series pairwise in a daisy-chain topology.

Figure 3:
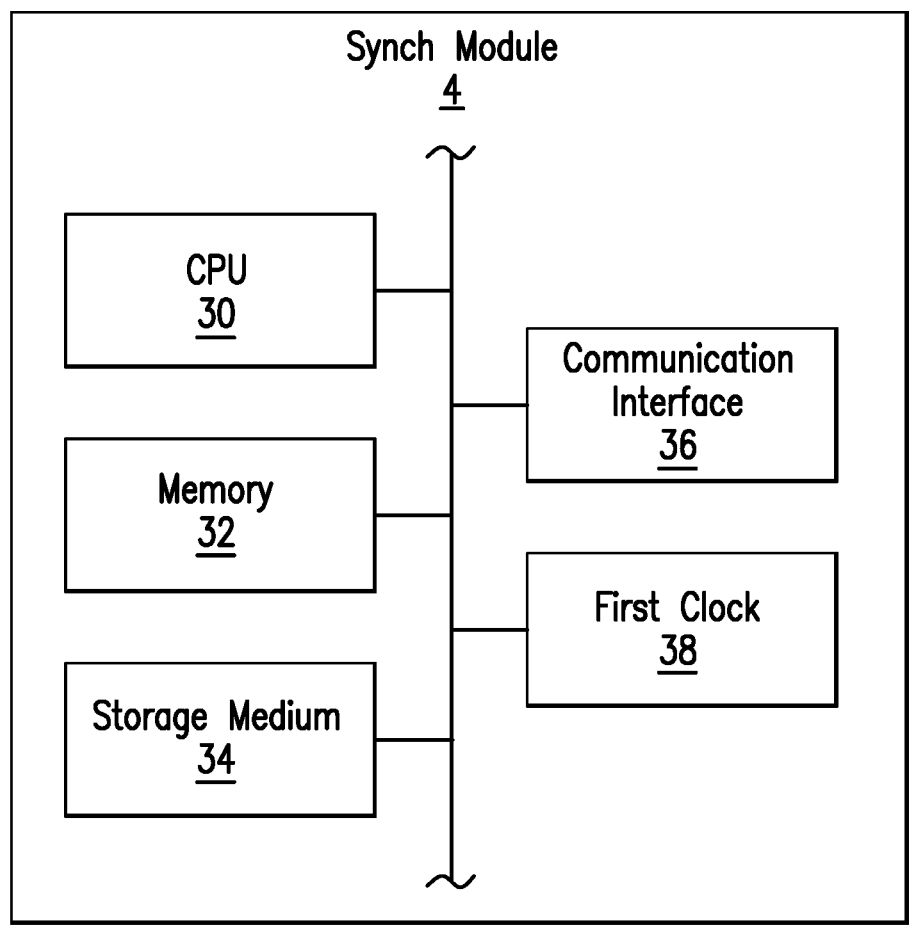
FIG. 3 is a schematic illustration of a synchronization module of the measurement system of FIG. 1.

As illustrated in FIG. 3, the synchronization module 4 comprises a central processing unit 30, a computational memory 32, a storage medium 34, a communication interface 36 and a first clock 38, which are here electrically connected together and implemented using circuits and electronic components.

In examples, the processing unit 30 is a microprocessor or a programmable microcontroller. The memory 32 and the medium 34 are memories, for example solid-state memories, such as a flash memory, and each forms a nonvolatile computer-readable data storage medium.

The communication interface 36 is able to be connected to the bus 10 and comprises to this end a connector physically connected to the bus 10 and a controller programmed to implement a predefined communication protocol.

The clock 38 comprises an electronic oscillator, for example a crystal oscillator, such as a quartz oscillator. For example, the clock 38 may be integrated into the unit 30. The clock 38 may be called the "main clock".

Figure 4:
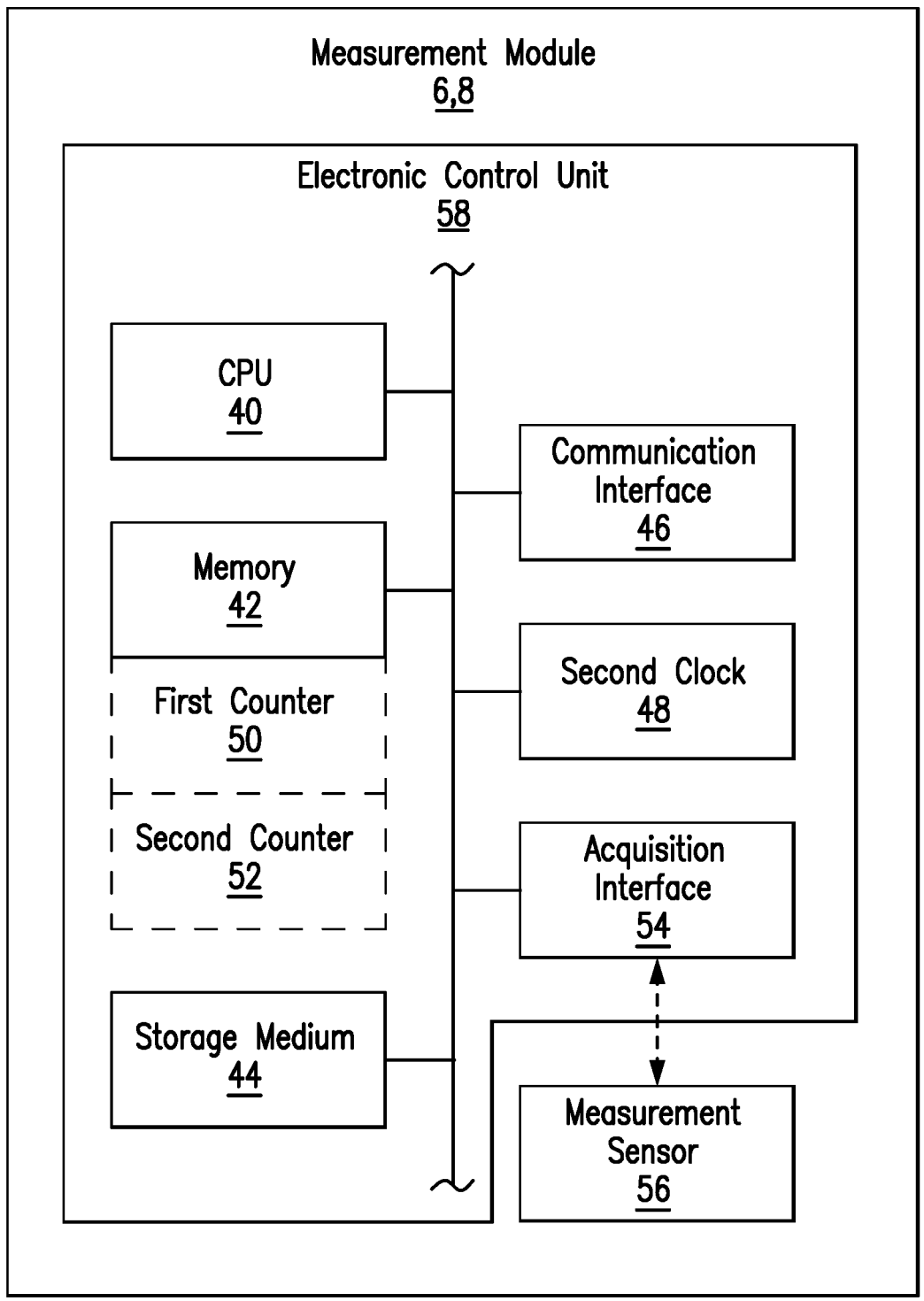
FIG. 4 is a schematic illustration of a measurement module of the measurement system of FIG. 1.

As illustrated in FIG. 4, each measurement module 6 and 8 comprises a central processing unit 40, a computational memory 42, a storage medium 44, a communication interface 46, which are for example analogous to the processing unit 30, to the computational memory 32, to the storage medium 34 and to the communication interface 36, respectively.

Each measurement module 6 and 8 also comprises:
a second clock 48 in order to implement a first counter 50 and a second counter 52,
an interface 54 for acquiring measurements, and
a measurement sensor 56 such as described above and connected to the acquisition interface 54.

For example, the acquisition interface 54 comprises an analogue-digital converter and/or a circuit for filtering and/or a circuit for processing the signal.

Each second clock 48 comprises an electronic oscillator, for example a crystal oscillator, such as a quartz oscillator. Each second clock 48 may be called a "local clock".

The constituents of each measurement module 6, 8 are here integrated into an electronic control unit 58 that may be separate from the sensor 56.

For example, the counters 50 and 52 are each implemented by the unit 40 by counting down a time value on the basis of a clock signal delivered by the clock 48. The current value of each counter 50 and 52 is stored at least temporarily in the memory 42.

In examples, each second clock 48 may have a lower precision than the first clock 38 and/or be more subject to a drift over time than the first clock 38.

In the considered examples, each module 4, 6, 8 is housed in a dedicated apparatus, for example an apparatus provided with its own casing and, for example, its own electrical power supply.

However, according to variants (not illustrated) various modules 4, 6 and 8 may be integrated into the same apparatus. For example, the synchronization module 4 may be integrated beside a measurement module 6 or 8 in the same apparatus. According to another example, the same apparatus may incorporate a measurement module 6 and a measurement module 8. In this case, the modules 6 and 8 may share the same electronic circuit 58, even if their respective sensors 56 are different. According to yet another example, a given apparatus may incorporate a plurality of measurement modules 6 and/or a plurality of measurement modules 8, which operate simultaneously and independently of one another within the apparatus in order to ensure a redundancy in the measurements of the electrical quantity.

In practice, each memory 32, 42 and/or each medium 34, 44 stores a software code and/or instructions that are executable and readable by the corresponding processing unit 30 or 40, respectively, in order to automatically implement one or more methods according to any one of the embodiments described and/or envisaged below.

According to variants (not illustrated) the modules 4, 6, 8 may comprise a dedicated electronic circuit, for example of ASIC type, or a reprogrammable logic circuit, for example of FPGA type.

Generally, according to various embodiments, a method for measuring electrical quantities implemented by the system 2 comprises:
the dispatching of a synchronization message on the data bus 10, by the synchronization module 4 connected to the data bus 10, the dispatching being carried out with a predefined emission period $T_{com}$, the emission period being counted down with the aid of the first clock 38 of the synchronization module 4;
the reception of the synchronization message, by the measurement modules 6, 8 connected to the data bus 10;
the countdown, by each measurement module 6, 8 that has received the synchronization message, of a first waiting duration $t_1$, the countdown being carried out, for each of the said measurement modules 6, 8, using the second clock 48 belonging to this measurement module;
for each of the said measurement modules 6, 8, the measurement of the electrical quantity by means of the corresponding sensor 56, at the end of the countdown of the first waiting duration.

Examples of operation of the system 2 according to first embodiments will now be described with reference to FIGS. 5, 6 and 7.

According to these implementations, the synchronization module 4 is therefore programmed to periodically emit synchronization messages on the data bus 10 with the emission period $T_{com}$. Each synchronization method is dispatched to all the measurement modules 6 and 8 connected to the data bus 10.

Figure 5:
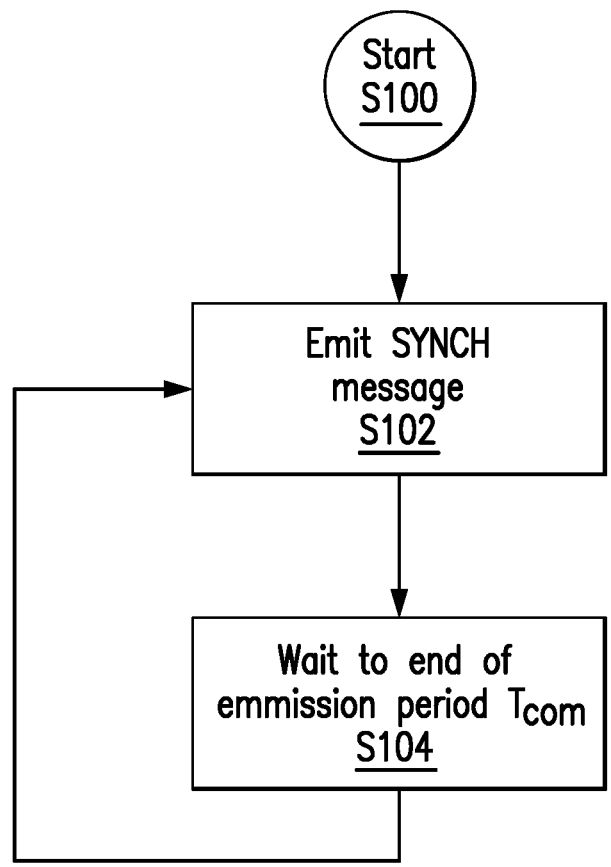
FIG. 5 is a flowchart of an example of a method for operating the synchronization module of FIG. 3.

For example, as illustrated in FIG. 5, after the start of the method (step S100), the synchronization module 4 emits a synchronization message on the bus 10 (step S102) then waits to the end of the emission period $T_{com}$ (step S104) before again emitting a synchronization message, the emission step S102 and waiting step S104 being repeated until the method stops.

Figure 6:
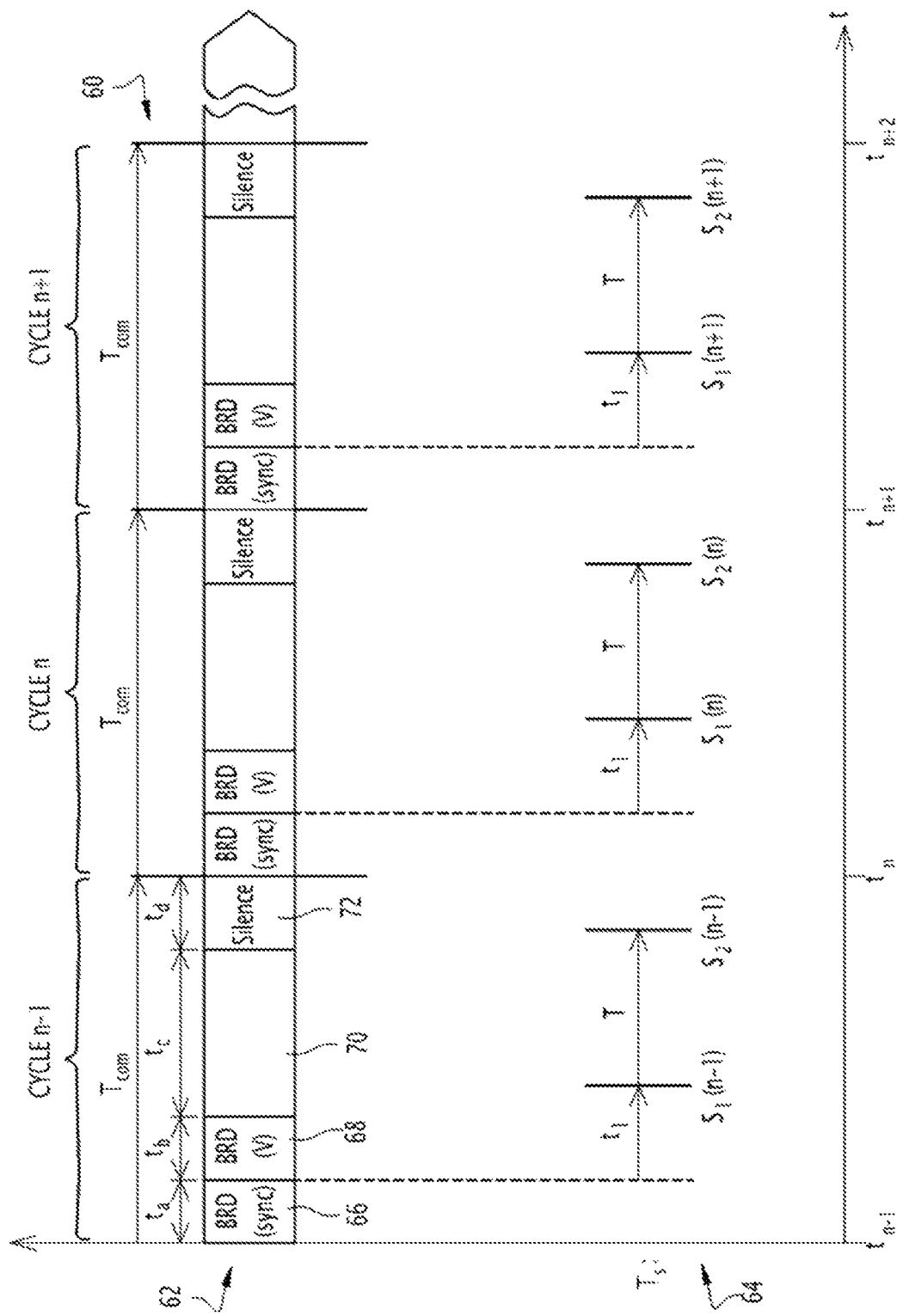
FIG. 6 is a timing diagram illustrating an example of operation of the measurement system of FIG. 1 according to a first embodiment.

In the timing diagram 60 shown in FIG. 6, the diagram 62 shows the data traffic exchanged on the data bus 10 during the operation of the system 2, in particular during three consecutive emission periods.

For example, a cycle of communication between the modules 4, 6 and 8 on the data bus 10 is defined for each emission period $T_{com}$. Three communication cycles, illustrated for the sake of example, are here denoted "cycle n−1", "cycle n" and "cycle n+1", where "n" is a non-zero integer. The x-axis represents a line of times "t" and indicates times $t_{n-1}$, $t_n$, $t_{n+1}$ and $t_{n+2}$. The times $t_{n-1}$, $t_n$, $t_{n+1}$ respectively correspond to the start of the cycles n−1, n and n+1 and the time $t_{n+2}$ corresponds to the end of the cycle n+1.

Each cycle starts with the emission of the synchronization message, which here has been given the reference 66. For example, the synchronization message includes a frame ("BRD (sync)") that is transmitted by broadcast to all the modules 6, 8 connected to the bus 10. The synchronization message 66 here has a duration denoted $t_a$.

By way of not necessarily limiting example, in each cycle, the synchronization message 66 is followed immediately by a message 68 emitted by the or each module 6 and containing one or more voltage values measured by the module 6. For example, the message 68 comprises a DataFrame ("BRD (V)") that contains a voltage value measured by this module 6 in the preceding cycle. The message 68 here has a duration denoted $t_b$.

The message 68 is followed by a range 70 of duration denoted $t_c$ during which the modules 6, 8 may transmit data on the data bus 10.

The range 70 is followed by a period of silence 72 of duration denoted $t_d$ and which marks the end of the cycle. For example, during the period of silence 72, the modules 6 and 8 are prevented from transmitting data on the data bus 10. This thus prevents the transmission of the following synchronization message 66 from being inhibited by the presence of other messages on the data bus 10 at the moment of its emission.

Thus, the sum of the durations $t_a$, $t_b$, $t_c$ and $t_d$ equal to the duration of the emission period $T_{com}$.

According to variants (not illustrated), the communication protocol used by the modules 4, 6, 8 to communicate on the data bus 10 may be different, and hence the order of the data and/or the type of data exchanged on the bus 10 after the emission of the message 66 may be defined differently.

For example, the messages 68 may be dispatched by the module 6 immediately after each measurement, without necessarily waiting for the following cycle. Thus, a plurality of messages 68 may be dispatched during each communication cycle, each message 68 containing the one or more voltage values measured for the immediately preceding measurement time.

According to variants, the periods of silence 72 may be omitted.

The row 64 of the timing diagram 60 shows times at which electrical-quantity measurements are carried out by one of the measurement modules 6, 8. For example, the reference $S_1(n-1)$ indicates the time at which a first measurement is carried out by this measurement module 6, 8 during the cycle n−1. The reference $S_2(n-1)$ indicates the time at which, where appropriate, a second measurement is carried out by the same module 6, 8 during the cycle n−1. The reference $S_1(n)$ indicates the time at which a first measurement is carried out during the cycle n. And so on.

The waiting duration $t_1$ is here counted down by the first counter 50, the current value of which is represented by the duration "$T_s$".

In practice, the first clock 38 is chosen to not significantly drift during one or more repetitions of the period $T_{com}$.

Figure 7:
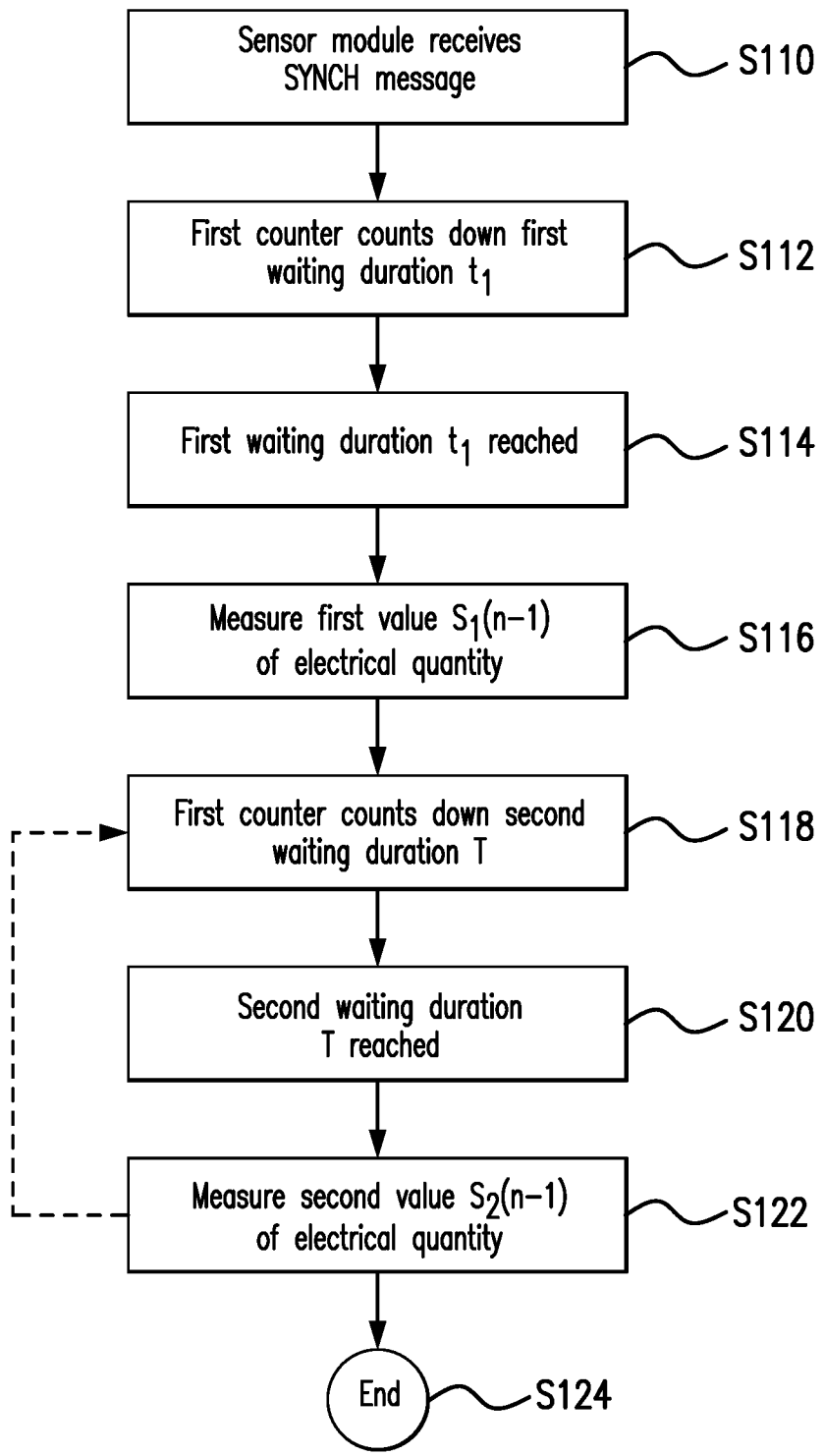
FIG. 7 is a flowchart of one example of a method for operating a measurement module of FIG. 4 according to the first embodiment.

As illustrated in FIG. 7, when one of the second modules 6, 8 receives a synchronization message 66 (step S110), the first counter 50 is triggered (step S112) and, by means of the clock 48, the time is counted until the first waiting duration $t_1$ is reached. The first waiting duration $t_1$ has a predefined value, which is for example recorded in the storage medium 44.

Once the first waiting duration $t_1$ has been reached (step S114) the measurement module 6, 8 measures a value $S_1(n-1)$ of the electrical quantity by means of the sensor 56 (step S116), for example by sampling by means of the acquisition interface 54. For example, the measured value $S_1(n-1)$ is then stored in the memory 42 and/or in the medium 44.

According to variants, the measurement module 6, 8 is programmed to measure a plurality of values of the electrical quantity in each communication cycle. The method then furthermore comprises, for each of the said measurement modules 6, 8:

at the end of the measurement of the electrical quantity, the countdown of a second waiting duration T, using the corresponding second clock 48, for example by means of the first sensor 50;

again measuring the electrical quantity, in an additional measurement, by means of the corresponding sensor 56, at the end of the countdown of the second waiting duration T.

Thus, once the first value $S_1(n-1)$ has been measured, the counter 50 counts down the second waiting duration T (step S118), analogously to step S112. For example, the counter 50 is reset at the start of step S118. In these embodiments, the value of the second waiting duration T is predefined, and for example stored in the medium 44.

Once the second waiting duration T has been reached (step S120), the measurement module 6, 8 measures a second value $S_2(n-1)$ of the electrical quantity by means of the sensor 56 (step S122), analogously to step S116.

Steps S118, S120 and S122 may be repeated as many times as necessary when the measurement module 6, 8 must measure the electrical quantity more than two times in each cycle. In the contrary case, the method ends with step S124 after the second measurement.

For example, the number "p" of measurements of the electrical quantity by a module 6, 8 during each cycle is higher than or equal to 1. In the illustrated example, the number of measurements "p" is equal to 2 for each cycle.

In practice, the emission period $T_{com}$ is chosen depending on the number of measurements and on the value of the second waiting duration T so that the measurements are finished at the end of each cycle.

It will be understood that, in the case where the number of measurements p is equal to 1, steps S118 to S122 are omitted.

For example, the method of FIG. 7 is implemented by each of the second modules 6, 8 on reception of a synchronization message 66. Steps S110 to S116 and, where appropriate, S118 to S122, are then repeated on reception of the following synchronization message in the following cycle.

It will be understood that the additional measurements $S_2(n-1)$, $S_2(n)$, $S_2(n+1)$, ... are not triggered directly by the reception of the synchronization message 66, but depend on the countdown of the second waiting duration by the second clock. In practice, the second clocks 48 are chosen not to significantly drift during one or more repetitions of the second waiting duration T.

As a variant, the method of FIG. 7, when implemented by the first measurement module 6, may furthermore comprise a step (not illustrated) of emitting the message 68 described above, this message 68 comprising a voltage value measured beforehand by this first measurement module 6, and for example measured in the preceding cycle.

The method of FIG. 7 is described with reference to a single module 6, 8. It will however be understood that this method is implemented independently by each module 6, 8 on reception of a synchronization message.

According to yet other optional variants (not illustrated) one or more additional steps may be implemented to compute a composite electrical quantity from one or more of the measured quantities. For example, a value of the composite electrical quantity is computed, for each cycle, from one or more of the electrical quantities measured by the measurement modules 6, 8. In one example, the composite electrical quantity is an electrical power. The computation is, for example, carried out by the modules 6, 8 themselves or by a dedicated processing unit (not illustrated) connected to the data bus 10 and implemented by an electronic circuit.

For example, this power is computed by each second measurement module 8 from the voltage value measured by the first measurement module 6 and transmitted in the message 68 and from current values measured by this measurement module 8.

The implementations of the invention described here thus allow the measurement of the electrical quantities to be synchronized between the various measurement modules 6, 8 of the measurement system 2. The electrical quantities may thus be measured simultaneously by the measurement modules 6, 8 of the system 2, or almost simultaneously. By "almost simultaneously" what is meant here is that the measurements are carried out during a time window of duration shorter than or equal to 50 µs.

Such a method is more advantageous than an artificial synchronization based on a temporal resync carried out subsequently on the basis of the computed phase shift between the voltage and current measurements, i.e. carried out after the measurements have been performed by the measurement modules.

Specifically, such a resync is not always satisfactory, because typically the phase shift must be determined by taking as reference specific voltage and current values among the measured values, for example by taking as reference the passage through zero of the current and voltage. Such a determination of the phase shift is frequently corrupted by the presence of harmonics in the measured quantities, and/or by deformations of the current and/or voltage signals resulting from upstream filtering of these signals. Such filtering is often required by electromagnetic compatibility standards.

Moreover, an external synchronization mechanism aiming to regularly resync the local clocks of the measurement modules to an external reference clock would consume too much bandwidth, clog up the data bus and would be complex to implement, in particular because it would require more sophisticated and therefore more expensive local clocks.

Implementations of the invention allow the measurement modules to be synchronized simply and reliably, this being advantageous in particular in applications in which the measurement modules 6, 8 must be inexpensive to manufacture and to maintain and must operate with limited computational resources, for example in applications in which the measurement modules 6, 8 must be deployed in large quantities in electrical installations 20 of large size.

In particular, as the second clocks 48 do not need to be as precise as the first clock 38, the cost of manufacture of the measurement modules 6, 8 is decreased thereby.

When a plurality of measurements are implemented for each communication cycle, it is not necessary to synchronize each measurement module 6, 8 before each measurement, since the measurement modules 6, 8 use the second waiting duration to determine when to carry out the measurement. The synchronization is therefore indirect.

Even though the second clocks 48 are relatively imprecise, the fact that the measurement modules 6, 8 are regularly resynchronized, for example in each cycle, i.e. after p measurements, allows a satisfactory synchronization of the additional measurements to be maintained.

Examples of operation of the system 2 according to second embodiments will now be described with reference to FIGS. 8 and 9.

The second embodiments are analogous to the first embodiments described above, and differ therefrom in particular in that:

the method furthermore comprises, for each of the said measurement modules 6, 8 that has received the synchronization message, measuring the time interval $T_{mes}$ separating the reception of two consecutive synchronization messages 66 by this measurement module 6, 8, this measurement being carried out by the measurement module 6, 8 using its second clock 48;

and in that the first waiting duration $t_1$ and the second waiting duration T are determined, for this measurement module 6, 8, depending on the said time interval $T_{mes}$ measured beforehand by this measurement module 6, 8.

Except from these differences, the description of the first embodiments is transposable to that of the second embodiments. In particular, the same reference numbers have been used to reference elements that are similar or identical, which elements will not be described again in detail. In particular, these second embodiments are able to be implemented by a measurement system 2 such as described above, the measurement modules 6, 8 being reprogrammed accordingly.

Figure 8:
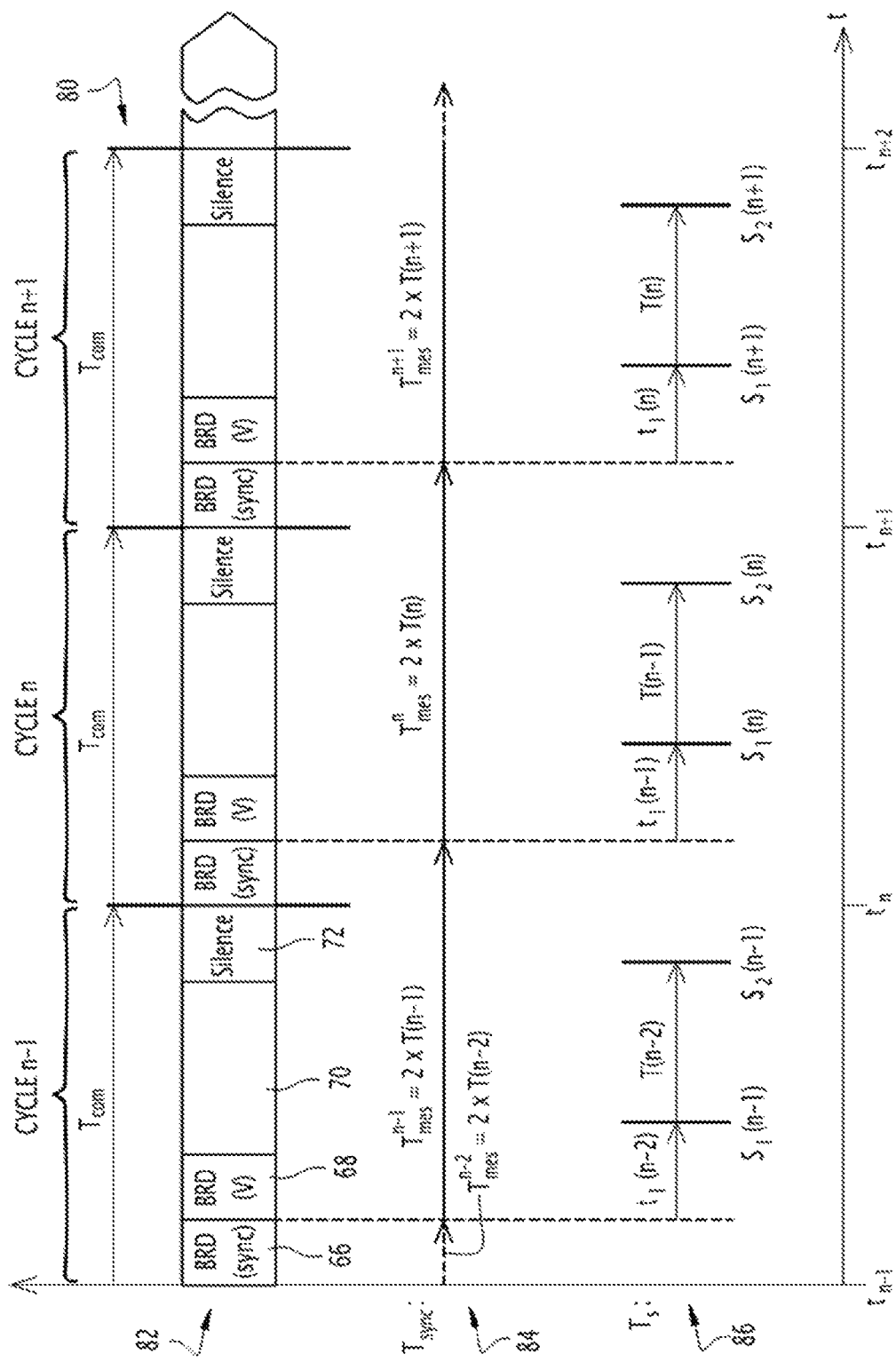
FIG. 8 is a timing diagram illustrating an example of operation of the measurement system of FIG. 1 according to a second embodiment.

In the timing diagram 80 shown in FIG. 8, the diagram 82 shows the data traffic exchanged on the data bus 10 during the operation of the system 2, in particular during three consecutive emission periods, similarly to the diagram 62 described above. However, once again, communication protocols other than the one described here by way of example may be envisaged.

The row 84 of the timing diagram 80 shows time intervals $T_{mes}$ separating the reception of two consecutive synchronization messages 66 by a given measurement module 6, 8.

For example, the reference $T^{n-1}_{mes}$ designates the value of the time interval $T_{mes}$ measured during the cycle n−1 between the reception of the synchronization message 66 marking the start of the cycle n−1 and the reception of the synchronization message 66 marking the start of the cycle n.

The time intervals $T_{mes}$ are here counted down by the second counter 52, the current value of which is represented by the duration "$T_{sync}$". In practice, the first and second counters 50, 52 may function independently of each other.

In examples, the time intervals $T_{mes}$ normally have the same duration as the period $T_{com}$, the potential measurement, processing and propagation durations of the messages on the bus 10 being considered to be negligible with respect to the duration of the period $T_{com}$.

The row 86 of the timing diagram 80 shows times at which measurements of the electrical quantity are carried out by one of the measurement modules 6, 8, analogously to the row 64 of the timing diagram 60.

Moreover, the reference $t_1(n-2)$ designates the particular value taken by the first waiting duration $t_1$ during the cycle n−1 the value of which is computed at the end of the cycle n−2 preceding the cycle n−1. The reference $t_1(n-1)$ designates the particular value taken by the first waiting duration $t_1$ during the cycle n the value of which is computed at the end of the cycle n−1. Similarly, the reference T(n−2) designates the particular value taken by the second waiting duration T during the cycle n−1 the value of which is computed at the end of the cycle n−2. And so on.

According to implementations, the first waiting duration $t_1$ is determined, for each of the measurement modules 6, 8, following each reception of a synchronization message by this measurement module, using a predetermined computational formula depending on the value of the time interval $T_{mes}$ measured beforehand by this measurement module.

For example, the first waiting duration $t_1$ is proportional to the said value of the said time interval with a first predefined coefficient of proportionality.

According to one example, the first coefficient of proportionality is equal to "alp" where "a" is a numerical value, which is for example strictly lower than 1. Thus, for each communication cycle n, the first waiting duration $t_1(n-1)$ is equal to the product of the coefficient a/p multiplied by the particular value $T^{n-1}_{mes}$ of the time interval $T_{mes}$ measured during the preceding cycle.

As a variant, the first waiting duration $t_1$ is computed for each communication cycle not only depending on the value of the time interval $T_{mes}$ measured beforehand but also depending on the history of values of the first waiting duration $t_1$, i.e. of preceding values of the first waiting duration $t_1$ measured for one or more preceding cycles. For example, the computed value of the first waiting duration $t_1$ takes into account an average of the computed values of the first waiting durations $t_1$ associated with a predefined number of preceding cycles. For example, this history may be recorded in the memory 42, 44 of the measurement module 6, 8 and may be updated in each cycle.

According to other variants, the computation of the first waiting duration $t_1$ for this cycle may take into account a history of values of the time interval $T_{mes}$ measured for prior cycles. For example, this history may be recorded in the memory 42 or 44 of the measurement module 6, 8 and may be updated in each cycle.

According to other embodiments, in cases where one or more additional measurements are taken, the second waiting duration T is determined, for each of the said measurement modules 6, 8, following each reception of the synchronization message by this measurement module, using a predetermined computational formula depending on the said time interval $T_{mes}$ measured beforehand by this measurement module.

For example, the second waiting duration T is proportional to the said value of the said time interval $T_{mes}$ depending on a second predefined coefficient of proportionality. By way of example, the first coefficient of proportionality is equal to "1/p". Thus, for each communication cycle n, the second waiting duration T(n−1) is equal to the product of the coefficient 1/p multiplied by the time interval $T^{n-1}_{mes}$ measured during the preceding cycle.

As a variant, the second waiting duration T is computed for each communication cycle not only depending on the value of the time interval $T_{mes}$ measured beforehand but also depending on a history of values of the second waiting duration T, such as an average of the computed values of the second waiting duration T associated with a predefined number of preceding cycles. For example, this history may be recorded in the memory 42, 44 of the measurement module 6, 8 and may be updated in each cycle.

Figure 9:
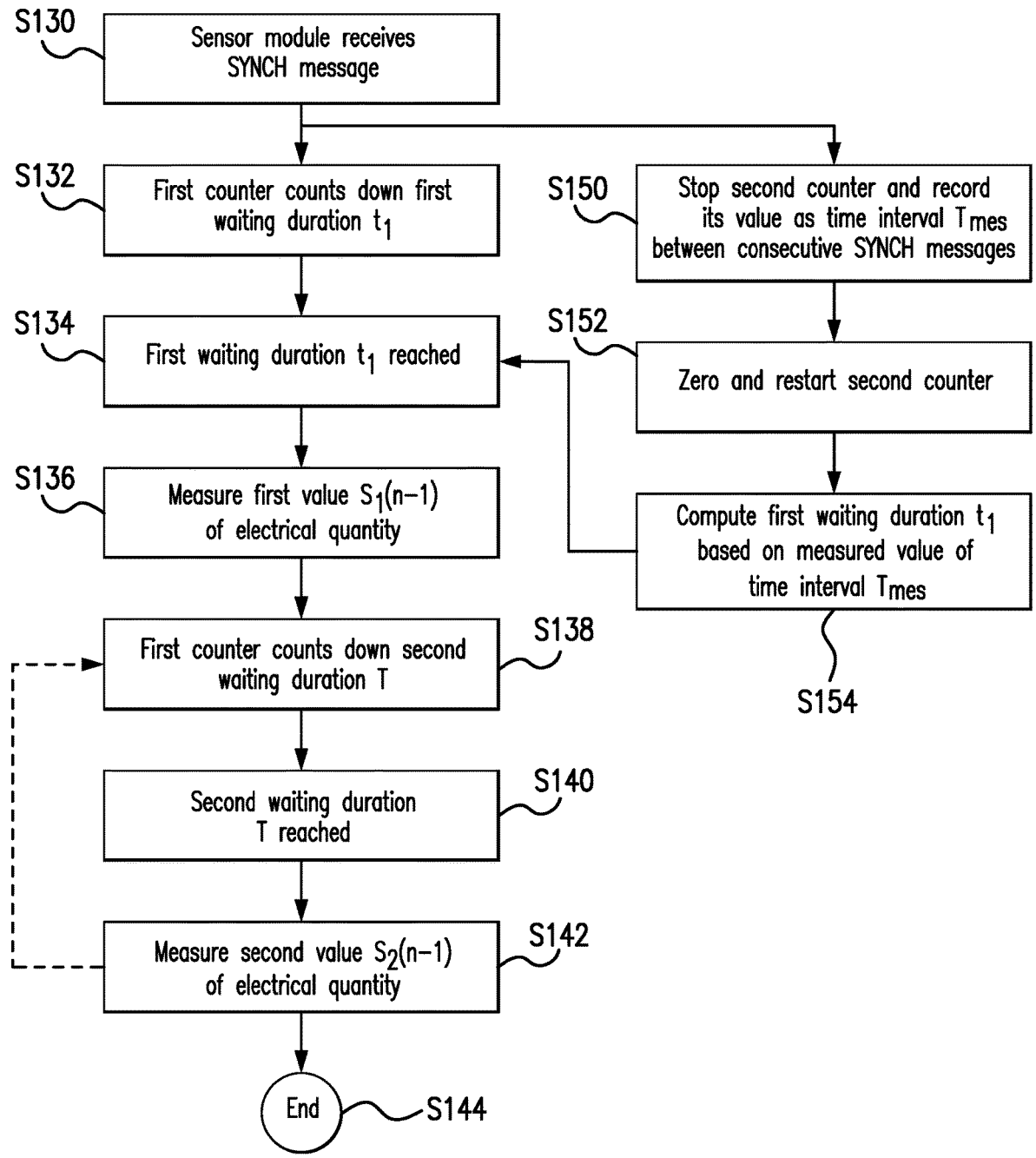
FIG. 9 is a flowchart of an example of a method for operating a measurement module of FIG. 4 according to the second embodiment.

As illustrated in FIG. 9, when one of the second modules 6, 8 receives a synchronization message 66 (step S130), the first counter 50 is triggered (step S132) and, by means of the clock 48, time is counted until the first waiting duration $t_1$ defined for this cycle is reached.

Once the first waiting duration $t_1$ has been reached (step S134), the module 6, 8 measures a value $S_1(n-1)$ of the electrical quantity by means of the sensor 56 (step S136). Once the first value $S_1(n-1)$ has been measured, the counter 50 counts down the second waiting duration T (step S138). For example, the counter 50 is reset at the start of step S138. Once the second waiting duration T has been reached (step S140), the module 6, 8 measures a second value $S_2(n-1)$ of the electrical quantity by means of the sensor 56 (step S142). Steps S138, S140 and S142 may be repeated as many as times as necessary when the measurement module 6, 8 must measure the electrical quantity more than two times in each cycle. In the contrary case, the method ends with step S144 after the second measurement.

For example, steps S130 to S144 are similar to steps S110 to S124 described above.

In parallel, the second counter 52 measures the duration separating the reception of two consecutive synchronization messages 66.

For example, initially, the second counter 52 was started in the preceding cycle and counts time from the reception of the synchronization message at the start of the preceding cycle.

On reception of the synchronization message 66, the module 6, 8 stops the second counter 52 and records the current value of this counter as being equal to the time interval $T_{mes}$ (step S150).

Next, the second counter 52 is zeroed then restarted (step S152) and starts to count down passing time, for example until the next iteration of step S150, which is initiated by the reception of the following synchronization message 66.

In a step S154, according to the circumstances, the value of the first waiting duration $t_1$ and/or of the second waiting duration T for this cycle is/are computed depending on the time interval $T_{mes}$ thus measured. The current values of the first waiting duration $t_1$ and/or of the second waiting duration T recorded in the memory of the module 6, 8 are updated accordingly.

Depending on the implementation, in this step S154, the computation of the value of the first waiting duration $t_1$ and/or of the second waiting duration T for this cycle may take into account, as explained above, a history of values of the first waiting duration $t_1$ and/or of the second waiting duration T and/or a history of values of the time interval $T_{mes}$.

When the first waiting duration is computed depending on the time interval $T_{mes}$ thus measured, then steps S150, S152 and S154 are preferably implemented before step S134, as illustrated in FIG. 9.

In practice, depending on the embodiment, the values of the first and second waiting durations $t_1$ and T may be recomputed for each cycle depending on the said measured time interval $T_{mes}$, as in the example described above. However, as a variant, only one of the first and second waiting durations $t_1$ and T may be recomputed for each cycle depending on the said measured time interval $T_{mes}$.

The second embodiments described above advantageously allow the synchronization of the measurements between the various measurement modules 6, 8 to be improved.

Specifically, as the first and second waiting durations $t_1$ and T are computed locally in each module depending on the time interval $T_{mes}$, and as these durations and intervals are measured by the same second clock 48 of the said module, potential drift in the said second clock 48 is thus automatically compensated for.

For example, if the oscillation frequency of the second clock 48 of a measurement module 6, 8 slows abnormally with respect to a reference clock, then the durations measured by this second clock 48 will appear to be shorter than they actually are. Thus, the time interval $T_{mes}$ measured by this clock 48 will be perceived to be shorter than it actually is. As this time interval is then used to compute the first waiting duration $t_1$ and, where appropriate, the second waiting duration T, the first and second waiting durations $t_1$ and T will decrease as a result. As the first and second waiting durations $t_1$ and T are then measured by the same clock 48, the error thus introduced into the computation of the first and second waiting durations $t_1$ and T will be compensated for by the drift in the clock 48, so that the first measurement, or even the additional measurements, will in the end be synchronized with the measurements of the measurement modules 6, 8.

It is therefore possible to measure the electrical quantities synchronously or almost synchronously, without needing to regularly update the second clocks 48 and without there being any need to use very precise second clocks 48, which would then be too expensive.

Examples of operation of the system 2 according to third embodiments will now be described with reference to FIG. 11.

The third embodiments are analogous to the first and second embodiments described above, and differ therefrom in particular in that the additional measurements are repeated until the following synchronization message is received. It will therefore be understood that in this case the number of measurements, denoted p, is higher than or equal to two.

Except from these differences, the description of the second embodiments is transposable to that of the third embodiments. In particular, the same reference numbers have been used to reference elements that are similar or identical, which elements will not be described again in detail. In particular, these third embodiments are able to be implemented by a measurement system 2 such as described above, the measurement modules 6, 8 being reprogrammed accordingly.

Figure 11:
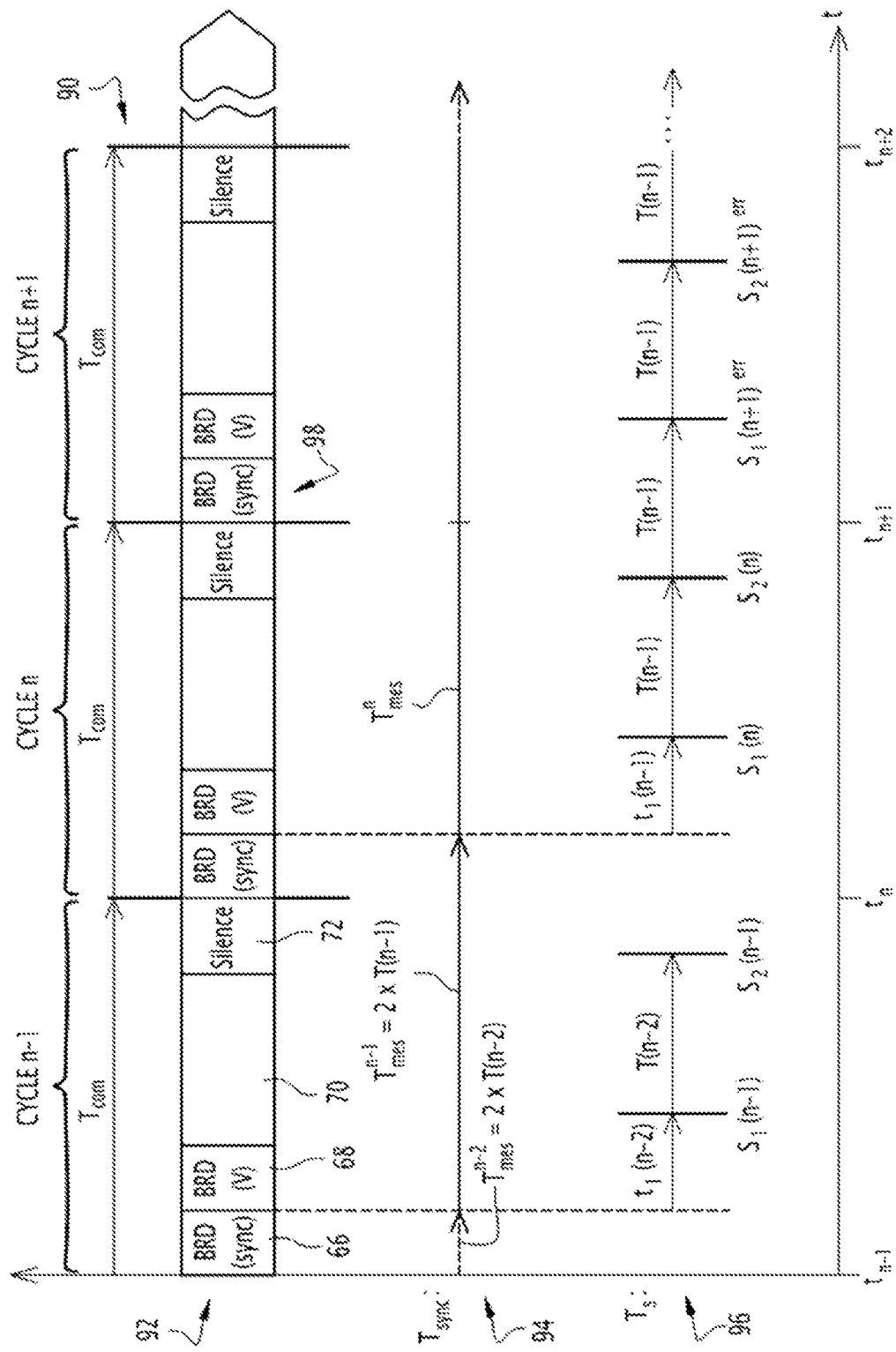
FIG. 11 is a timing diagram illustrating an example of operation of the measurement system of FIG. 1 according to a third embodiment.

In the timing diagram 90 shown in FIG. 11, the diagram 92 shows the data traffic exchanged on the data bus 10 during the operation of the system 2, in particular during three consecutive emission periods, similarly to the diagram 62 described above. However, once again, communication protocols other than that described here by way of example may be envisaged.

Row 94 of the timing diagram 90 shows time intervals $T_{mes}$ separating the reception of two consecutive synchronization messages 66 by the same measurement module 6, 8, similarly to row 84 of the timing diagram 80.

Row 96 of the timing diagram 90 shows times at which measurements of the electrical quantity are carried out by one of the measurement modules 6, 8, analogously to row 86 of the timing diagram 60.

The third embodiments are particularly applicable in the case where one of the synchronization messages 66 is not received by a measurement module 6, 8, or is received late. In the illustrated example, the synchronization message of the cycle n+1 indicated by the reference 98 is not received.

Thus, the implementation of the method described above with reference to FIG. 9 is similar, except that the steps S138, S140 and S142 implementing the additional measurements of the electrical quantity continue to be repeated until reception of a synchronization message 66.

When the synchronization message 66 is received normally, as is the case at the end of the cycle n−1 in the example of FIG. 11, this repetition is interrupted and steps S132 and S150 are implemented normally as described above. In particular, the first counter 50 is reset in order to count down the first waiting duration $t_1$(n−1) and the second counter 52 is reset.

However, if the synchronization message 66 is not received, as is the case at the start of the cycle n+1 in the example of FIG. 11, the measurements of the electrical quantity continue to be implemented based on the second waiting duration T(n−1) computed in the preceding cycle and not updated, even though the cycle n has in fact ended and the following cycle n+1 has started. Thus, the measurement module 6, 8 in question is temporally not resynchronized with the other measurement modules 6, 8.

The measurements of the electrical quantities made by this measurement module during the cycle n+1 when the measurement module has not been resynchronized and continues to use the second waiting duration T(n−1), which has not been updated, are denoted $S_1(n+1)^{err}$ and $S_2(n+1)^{err}$.

In parallel, the second counter 52 continues to operate, provided that no synchronization message 66 is received.

Subsequently, when a synchronization message 66 is again correctly received, step S132 and, where appropriate, step S150 of the method are implemented as described above, this allowing the measurement module in question to be resynchronized with the other measurement modules. However, this value of the time interval $T_{mes}$ computed by the second counter 52 is preferably not taken into account subsequently since it is not representative of the interval between the emission of two consecutive synchronization messages 66.

For example, a measured value of the time interval $T_{mes}$ is automatically rejected if the number of measurements carried out by the measurement module 6, 8 during this time interval $T_{mes}$ is different from a predefined number of measurements, for example higher than the maximum number of measurements p.

By "rejected" what is meant here is that this measured value of the time interval $T_{mes}$ is not taken into account by this measurement module to compute a value of the first waiting duration $t_1$ or of the second waiting duration T.

Moreover, in certain optional variants, a synchronization error may be detected if a cycle ends prematurely because of the premature reception of a synchronization message, such an error being identified when the number of measurements performed in this cycle is measured as being lower than the number of measurements p.

The third embodiments described above thus allow, in addition to other advantages, continuity of operation of the measurement module without corruption of the synchronization of the measurements in isolated cases of poor reception of the synchronization message. The operating method is thus more robust in case of error. Even if a potential drift in the local clock 48 is temporarily no longer compensated for, this will be the case over a small number of measurement intervals, and hence the impact on the reliability of the measurements will remain limited.

Figure 10:
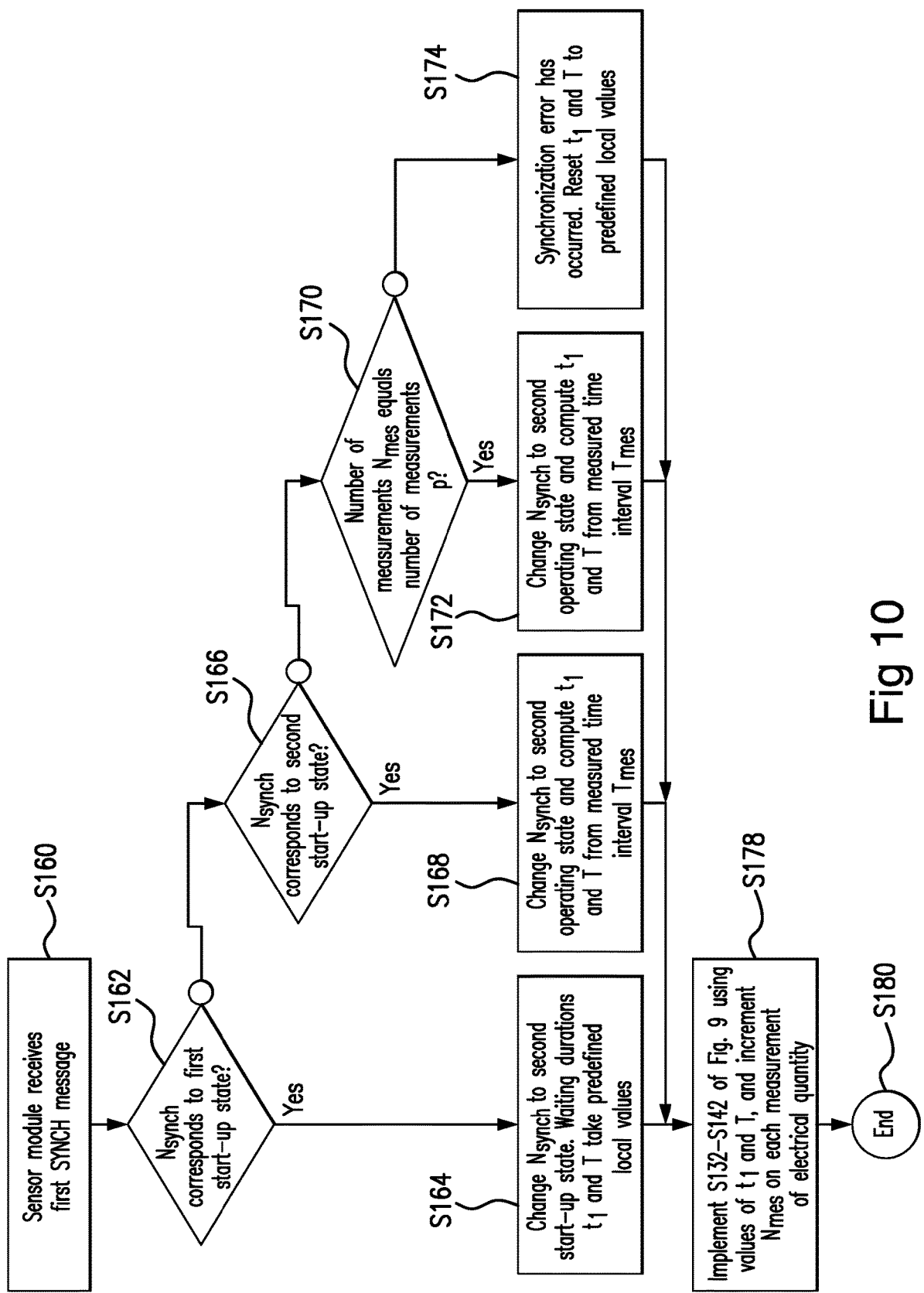
FIG. 10 is a flowchart of an example of a method for operating the system of FIG. 1.

An example of operation of a measurement module 6 or 8 following its initialization is now described with reference to FIG. 10.

In this example, a first variable Nsync is defined as indicating the initialization state of the module. For example, the variable Nsync may take a plurality of predefined states, a first start-up state, a second start-up state and a normal operating state.

A second variable Nmes is defined, the current value of which indicates the number of measurements carried out by the said module 6 or 8. For example, the variables Nsync and Nmes are stored in memory 42.

When the module 6 or 8 is started up, it implements an initialization sequence in which the variable Nsync is initialized to a first value corresponding to the first start-up state. The variable Nmes is initialized to zero. The second waiting duration T is set equal to a predefined local value, for example recorded beforehand in the memory 42 or 44. The second counter 52 is triggered. Likewise, the first waiting duration $t_1$ is set equal to a predefined local value, for example recorded beforehand in the memory 42 or 44, with a view to the next reception of the synchronization message 66.

The module 6, 8 is then in a first start-up state, in which the measurement is not synchronized with the other measurement modules and is based on locally defined waiting durations. One or more measurements of the electrical quantity may then be carried out in steps analogous to steps S142 on each expiry of the first counter 52 at the end of the second duration T, the variable Nmes being incremented on each measurement. However, this situation will change on reception of the first synchronization message 66.

Following the reception of the synchronization message 66 (step S160), the value of the variable Nsync is checked automatically.

If the value of the variable Nsync is determined as corresponding to the first start-up state (step S162) then the value of the variable Nsync is changed to the second start-up state and the values of the first and second waiting durations $t_1$ and T take the predefined values (step 164).

Next, steps S132 to S142, such as described above, are implemented with the values of the first and second waiting durations $t_1$ and T thus defined, the variable Nmes being incremented on each measurement of the electrical quantity by the sensor 56 (step S178). In other words, the module 6, 8 is in a second start-up state in which the measurement is synchronized with the other measurement modules, but in which the clock is not corrected. The method ends with step S180, until the following synchronization message 66 is received.

If after step S160 the value of the variable Nsync is determined as corresponding to the second start-up state (step S166), then the value of the variable Nsync is changed to the normal operating state and the values of the first and second waiting durations $t_1$ and T are computed from the value of the measured time interval $T_{mes}$ (step S168). Next, step S132 and the following steps, such as described above, are implemented with the values of the first and second waiting durations $t_1$ and T thus computed, the variable Nmes being incremented on each measurement of the electrical quantity by the sensor 56 (step S178).

Subsequently, the measurement module 6, 8 is in a nominal operating mode in which the measurements are synchronized and potential offset of the local clock 48 is compensated for. For example, step S132 and the following steps, such as described above, are implemented.

If following the reception of a new synchronization message 66 the variable Nsync is not in one of the start-up states and the number of measurements Nmes is identified as being equal to the number of measurements p (step S170), the measurement module 6, 8 is considered to still be in a nominal operating mode (step S172). In the contrary case (step S174), if the variable Nmes has a value different from the number of measurements p, then a synchronization error is considered to have occurred.

For example, if a synchronization error is considered to have occurred, then a reset (step S174) is performed in which the values of the first and second waiting duration $t_1$ and T are each reset to the predefined local value described above. The first counter 50 is reset with the predefined local value of the first waiting duration $t_1$ and the second counter 52 is reset in order to restart the countdown of the time interval $T_{mes}$. The variable Nsync is reset to the second start-up state. Thus, the measurement continues to be carried out synchronously, but the compensation for the drift of the local clock 48 is temporarily inhibited, until a time interval $T_{mes}$ representative of the duration $T_{com}$ of the communication cycle is once again available.

Many other embodiments are possible.

In certain optional variants, the value of the first waiting duration $t_1$ may be adjusted locally for each measurement module 6, 8, in order to take into account potential delays inherent to the measurement circuit or to the communication bus 10, so as to promote a simultaneous or almost simultaneous reception of each synchronization message 66 by all the measurement modules 6, 8.

For example, in the case where the modules 4, 6, 8 are connected to the data bus 10 in a daisy-chain topology, the measurement modules 6, 8 may not receive the synchronization message 66 at the same time, depending on their position on the data bus 10. In this case, the waiting duration $t_1$ may be adjusted locally for each measurement module 6, 8, in order to take into account the time that the synchronization message takes to propagate contiguously between the measurement modules.

The adjustment may comprise the addition or the removal of a predefined delay in each measurement module 6, 8, this predefined delay being specific to each module 6, 8. For example, the predefined delay is computed on the basis of the technical specifications of the module 6, 8 and/or of the data bus 10, or determined after calibration. The predefined delay is for example recorded in the memory of the module 6, 8.

In examples, in the embodiments in which the first waiting duration $t_1$ is predefined and is not computed depending on the time interval $T_{mes}$, the adjustment may be carried out during the manufacture or the installation of the system 2 by directly choosing a value of the first waiting duration $t_1$ that takes into account previously quantified potential delays. In embodiments in which the first waiting duration $t_1$ is automatically recomputed for each communication cycle depending on the time interval $T_{mes}$, the adjustment may be carried out in step S152 or step S154, by adding or subtracting the predefined delay.

More generally, in the methods of implementation described above, the dispatching of the synchronization message 66 is carried out periodically. The emission period $T_{com}$ has a set value, which is for example predefined in advance.

However, according to variants, the synchronization message 66 is not emitted periodically and the dispatching of the synchronization message 66 is carried out with an emission cycle of variable duration $T_{com}$.

This variation may be known in advance, i.e. the emission period $T_{com}$ may, in each cycle, take a value chosen from a plurality of predefined values. For example, the emission period $T_{com}$ alternates between a first duration and a second duration longer than the first duration.

Preferably, when the emission of the synchronization message 66 is not periodic, the synchronization message 66 dispatched by the module 4 comprises time-related data, these data for example including a value of the first waiting duration $t_1$ indicating the waiting duration before the first measurement to be performed in the course of the cycle.

In embodiments, on reception of the synchronization message 66, the first counter 50 is updated with the received value of the first waiting duration $t_1$.

Preferably, the value of the first waiting duration $t_1$ featuring in the synchronization message 66 is computed by the module 4. In addition, when a synchronization of the clocks is implemented, for example similarly to the synchronization of the method described with reference to FIGS. 9 and 11, then the time data contained in the synchronization message 66 may furthermore comprise the value of the time $T_{cyc}$ passed since the dispatching of the last synchronization message 66 by the module 4. For example, the time $T_{cyc}$ indicates the duration of the communication cycle that has just ended. Thus, the step S154 may be modified to compute the values of the first waiting duration $t_1$ and the second waiting duration T differently.

According to other alternative embodiments, the number of measurements carried out by the modules 6, 8 is not necessarily the same in each cycle. In other words, the number of measurements may vary from one cycle to the next.

These alternative embodiments are particularly applicable to embodiments in which the emission period $T_{com}$ is not constant: since certain cycles are longer than others, more measurements may be carried out during these cycles.

In this case, preferably, the synchronization message 66 comprises time-related data, such as described above, in particular including a value of the first waiting duration $t_1$ and/or a value of the time $T_{cyc}$ passed since the dispatching of the last synchronization message 66 by the module 4.

Preferably, the synchronization message 66 also comprises an indicator of the number of measurements carried out since the last synchronization by the said measurement module 6, 8.

For example, the synchronization module 4 is programmed to count the number of measurements carried out in each cycle by all or some of the measurement modules 6, 8, then to include the number of measurements thus counted in the synchronization message marking the start of the following cycle.

For example, this count is advantageously obtained by counting the number of measured values included in the dispatched data message 68, or, for embodiments in which such a data message 68 is dispatched immediately after each measurement, by counting the number of data messages 68 emitted in each cycle by a module 6, 8.

During the implementation of the method, knowledge of the number of measurements, which number is received in the synchronization message 66, allows an anomaly in the operation of the measurement module to be detected, with a view to for example determining that a preceding synchronization message was not received. This may be determined by comparing the number of measurements indicated in the received synchronization message 66 with the number of measurements recorded in the variable Nmes.

The embodiments and the variants envisaged above may be combined together to form new embodiments.

The invention claimed is:

1. A method for measuring electrical quantities, comprising:
   dispatching a synchronization message on a data bus, by a synchronization module connected to the data bus, the dispatching being carried out with an emission period, the emission period being counted down with aid of a first clock of the synchronization module;
   receiving the synchronization message, by measurement modules connected to the data bus, each measurement module comprising a sensor adapted to measure an electrical quantity, each measurement module also comprising a second clock;
   counting down, by each measurement module that has received the synchronization message, a first waiting duration, the counting down being carried out, for each of the measurement modules, using the second clock of the measurement module; and
   for each of the measurement modules, measuring the electrical quantity using the corresponding sensor, at the end of the counting down of the first waiting duration,
   wherein the method further comprises, for each of the measurement modules, measuring a time interval separating reception of two consecutive synchronization messages by the measurement module, the measuring of the time interval being carried out by the measurement module using the second clock of the measurement module, and
   wherein the first waiting duration is determined, for the measurement module, following each reception of a synchronization message by the measurement module, based on the time interval measured beforehand by the measurement module.

2. The method according to claim 1, wherein the method further comprises, for each of the measurement modules:
   at the end of the measurement of the electrical quantity, counting down a second waiting duration, using the corresponding second clock; and
   again measuring the electrical quantity, in an additional measuring, by means of the corresponding sensor, at the end of the counting down of the second waiting duration.

3. The method according to claim 2, wherein the second waiting duration is determined, for each of the measurement modules, depending on the time interval measured beforehand by the measurement module.

4. The method according to claim 3, wherein the second waiting duration is determined, for each of the measurement modules, following each reception of a synchronization message by the measurement module, using a predetermined computational formula depending on the time interval measured beforehand by the measurement module.

5. The method according to claim 4, wherein the second waiting duration is proportional to the value of the time interval depending on a second predefined coefficient of proportionality.

6. The method according to claim 2, wherein the additional measurements are repeated by the measurement module until a following synchronization message is received by the measurement module.

7. The method according to claim 1, wherein the first waiting duration is determined, for each of the measurement modules, following each reception of a synchronization message by the measurement module, using a predetermined computational formula depending on the value of the time interval measured beforehand by the measurement module.

8. The method according to claim 7, wherein the first waiting duration is proportional to the value of the time interval depending on a first predefined coefficient of proportionality.

9. The method according to claim 1, wherein the measured time interval is not taken into account by the measurement module when a number of measurements made by the measurement module during the time interval is different from a predefined number of measurements.

10. The method according to claim 1, wherein dispatching the synchronization message is carried out periodically with the emission period.

11. The method according to claim 1, wherein dispatching the synchronization message is carried out with an emission period of variable duration.

12. The method according to claim 1, wherein the measurement modules are associated with electrical conductors of an electrical installation, at least one of the measurement modules being configured to measure an electrical voltage, at least one of a plurality of other measurement modules being configured to measure a magnitude of an electrical current.

13. The method according to claim 1, wherein the time interval is measured during an immediately preceding cycle of the emission period between reception of a synchronization message marking a start of the immediately preceding cycle of the emission period and reception of a synchronization message marking a start of a current cycle of the emission period.

14. A system for measuring electrical quantities, comprising:
   a synchronization module comprising a first clock;
   measurement modules each measurement module comprising a sensor adapted to measure an electrical quantity, each measurement module also comprising a second clock, and
   a data bus, the synchronization module and the measurement modules being connected to the data bus,
   wherein the synchronization module is configured to periodically dispatch a synchronization message on the data bus, with a predefined emission period, the emission period being counted down with the aid of the first clock;
   and wherein each measurement module is configured to:
      receive synchronization messages,
      after each reception of a synchronization message, count down a first waiting duration, the countdown being carried out, for each of the measurement modules, using the second clock of the measurement module; and
      measure the electrical quantity using the corresponding sensor at the end of the countdown of the first waiting duration,
   wherein each measurement module is further configured to measure a time interval separating reception of two consecutive synchronization messages by the measurement module, the measuring of the time interval being carried out by the measurement module using the second clock of the measurement module, and
   wherein the first waiting duration is determined, for the measurement module, following each reception of a synchronization message by the measurement module, based on the time interval measured beforehand by the measurement module.

15. The system according to claim 14, wherein each measurement module is further configured to:
   at the end of the measurement of the electrical quantity, count down a second waiting duration, using the corresponding second clock; and
   again measure the electrical quantity, in an additional measurement, by means of the corresponding sensor, at the end of the countdown of the second waiting duration.

16. The system according to claim 15, wherein each measurement module is further configured to repeat the additional measurements until a following synchronization message is received by the measurement module.

17. The system according to claim 14, wherein the time interval is measured during an immediately preceding cycle of the emission period between reception of a synchronization message marking a start of the immediately preceding cycle of the emission period and reception of a synchronization message marking a start of a current cycle of the emission period.

* * * * *